US009169564B2

(12) United States Patent
Kuznetsov et al.

(10) Patent No.: US 9,169,564 B2
(45) Date of Patent: Oct. 27, 2015

(54) SYSTEMS AND METHODS FOR RAPID LIQUID PHASE DEPOSITION OF FILMS

(75) Inventors: Oleg A. Kuznetsov, Columbus, OH (US); Yuanchang Zhang, Columbus, OH (US)

(73) Assignee: NATCORE TECHNOLOGY, INC., Rochester, NY (US)

( * ) Notice: Subject to any disclaimer, the term of this patent is extended or adjusted under 35 U.S.C. 154(b) by 221 days.

(21) Appl. No.: 13/396,136

(22) Filed: Feb. 14, 2012

(65) Prior Publication Data

US 2012/0207932 A1    Aug. 16, 2012

Related U.S. Application Data

(60) Provisional application No. 61/442,402, filed on Feb. 14, 2011.

(51) Int. Cl.
| | |
|---|---|
| *B05D 1/18* | (2006.01) |
| *B05D 3/00* | (2006.01) |
| *C23C 18/12* | (2006.01) |
| *H01L 21/02* | (2006.01) |

(52) U.S. Cl.
CPC ...... *C23C 18/1216* (2013.01); *H01L 21/02153* (2013.01); *H01L 21/02164* (2013.01); *H01L 21/02282* (2013.01); *H01L 21/02565* (2013.01); *H01L 21/02628* (2013.01)

(58) Field of Classification Search
CPC ..................................... B05D 1/40; B05D 3/12
USPC ........................................................ 427/245
See application file for complete search history.

(56) References Cited

U.S. PATENT DOCUMENTS

| 4,059,680 | A | | 11/1977 | Leathers et al. |
|---|---|---|---|---|
| 4,468,420 | A | * | 8/1984 | Kawahara et al. ......... 427/397.7 |
| 4,882,183 | A | * | 11/1989 | Ino et al. .................... 427/126.6 |
| 5,506,006 | A | * | 4/1996 | Chou et al. ................. 427/430.1 |
| 6,613,697 | B1 | * | 9/2003 | Faur et al. ..................... 438/770 |
| 7,718,550 | B2 | | 5/2010 | Barron et al. |
| 2002/0173170 | A1 | * | 11/2002 | Liang et al. ................... 438/784 |
| 2003/0027433 | A1 | * | 2/2003 | Faur et al. ..................... 438/770 |
| 2009/0200509 | A1 | * | 8/2009 | Suzuki et al. ............... 252/182.1 |

OTHER PUBLICATIONS

International Search Report and Written Opinion for PCT/US2012/25009 dated May 29, 2012.
Lee M-K et al: "Characterization of Titanium Oxide Films Prepared by Liquid Phase Deposition Using Hexafluorotitanic Acid", Japanese Journal of Applied Physics, Japan Society of Applied Physics, JP, vol. 39, No. 2A, Part 02, Feb. 1, 2000, pp. L101-L103.
Homma T et al: "A Selective SI02 Film-Formation Technology Using Liquid-Phase Deposition for Fully Planarized Multilevel Interconnections", Journal of The Electrochemical Society, Electrochemical Society, vol. 140, No. 8, Aug. 1, 1993, pp. 2410-2414.

\* cited by examiner

*Primary Examiner* — Dah-Wei D Yuan
*Assistant Examiner* — Kristen A Dagenais
(74) *Attorney, Agent, or Firm* — Winstead PC

(57) ABSTRACT

A rapid liquid phase deposition (LPD) process of coating a substrate provides improved deposition rates. The LPD process may include the following steps: incubation of acids with corresponding oxides, sulfide, or selenide for a predetermined period of time; removing the undissolved oxides, sulfide, or selenide; liquid phase deposition of the oxide, sulfide, or selenide film or coating at an elevated temperature; and removing the substrate from the growth solution. Further, the growth solution can be prepared for re-use by cooling to a desired temperature and adding extra oxides, sulfides, or selenides.

12 Claims, 3 Drawing Sheets

SYSTEMS AND METHODS FOR RAPID LIQUID PHASE DEPOSITION OF FILMS

RELATED APPLICATIONS

This application claims the benefit of U.S. Provisional Patent Application No. 61/442,402 to Kuznetsov et al., filed on Feb. 14, 2011, which is incorporated herein by reference.

FIELD OF THE INVENTION

This invention relates to rapid deposition in the liquid phase of films or coatings on various substrates.

BACKGROUND OF INVENTION

There are various methods used to grow inorganic materials onto a substrate that are well-known in industry. For example, growth processes such as chemical vapor deposition (CVD), sol-gel, and liquid phase deposition (LPD) may be utilized to grow inorganic materials on a substrate. For example, U.S. Pat. No. 7,718,550 to Barron et al. granted on May 18, 2010 discusses low temperature growth of inorganic materials.

Solar cells may provide several layers of inorganic materials, such as a light-absorption, electrodes, light-responsive, and anti-reflective layers. Films or coatings including, but not limited to, $SiO_2$, $TiO_2$, $ZrO_2$, $In_2O_3$, $SnO_2$, $BaTiO_3$, $ZnS$, $Bi_2Se_3$, and/or the like may be utilized in solar cells. LPD provides a low cost process for depositing films or coatings. However, LPD can be further improved with increase deposition, further simplification, and/or reusability of the growth solution.

SUMMARY OF THE INVENTION

In an illustrative implementation, a rapid liquid phase deposition (LPD) process may include the following steps: incubation of the acids with oxides at room temperature or lower for a predetermined period of time; removing the undissolved oxides; cleaning the wafers; liquid phase deposition of a film at an elevated temperature; and removing wafers from the solution. In some implementations, the acid may be a fluoro acid. In some implementations, a fluoro acid may be mixed with one or more oxides. In some implementations, acid and oxide mixtures may be mixed and incubated separately and combined later. In other implementations, all of the acid and oxide mixtures are combined, mixed, and incubated.

Further, the used growth solution may be recycled or recovered by cooling it down to room temperature or lower. Oxides corresponding to the initial oxides may be added, then the mixture may be mixed and incubated, thereby making the mixture suitable for reuse. In other implementations, an acid and sulfide(s) or selenide(s) mixture may be substituted and utilized for liquid phase deposition when a sulfide or selenide film is desired.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1A:
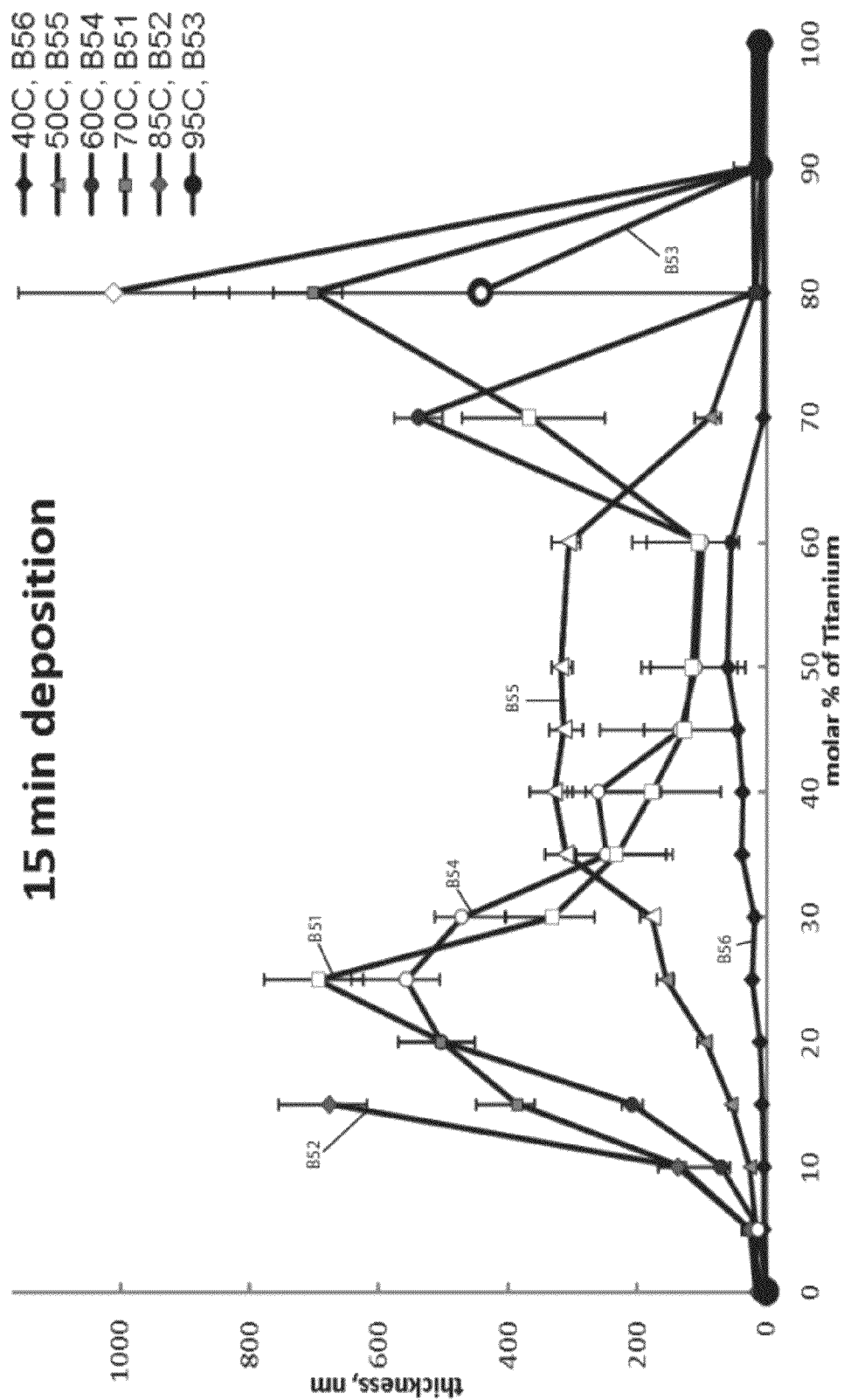
FIGS. 1a and 1b show film thickness as a function of the growth solution composition and temperature after 15 minute deposition and 45 minute deposition.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular embodiments of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

The following description provides a new process of rapid deposition of films or coatings with good optical properties on various substrates in the liquid phase. For example, a non-limiting illustrative implementation of a new process for the deposition of oxide coatings on silicon solar cells is discussed herein. Systems and methods for rapid deposition of oxide coatings discussed herein provide a simple, low cost process for depositing oxide films on a substrate. Further, the systems and methods increase deposition rates and allow for re-use of a growth solution.

Systems and methods for rapid deposition of films or coatings may involve the following steps in the deposition process. A growth solution is prepared by incubation of an acid with one or more corresponding oxides occurring at room temperature or lower for a predetermined period of time. In some implementations, an oxide and fluoro acid may be combined to provide a growth solution. A corresponding acid and oxide may both share a particular chemical element. In some implementations, the particular chemical element shared is a constituent of the film to be deposited on a substrate. For example, silica may be combined with hexafluorosilicic acid to provide a growth solution for $SiO_x$. In some implementations, more than one acid and oxide mixture may be utilized. Further, the acid and oxide mixtures may be incubated separately, and the two mixtures may be combined and incubated later. For example, titania may be combined with fluorotitanic acid to form a second mixture that is combined later with a silica hexafluorosilicic acid mixture. The undissolved oxides may be removed from the combined mixture, such as by cyclone separation, filtration, or the like. If substrates to be coated have not been pre-cleaned, the substrates should be cleaned prior to deposition. The substrates are placed in the growth solution for liquid phase deposition (LPD) of the oxide film. In some implementations, the LPD may occur at an elevated temperature above room temperature. The substrates are removed from the growth solution, washed, and dried. If re-usage of the growth solution is desired, the growth solution is cooled down to the room temperature, and extra oxides are added. In other implementations, sulfides or selenides may be substituted in place of oxide(s) when a sulfide or selenide film or coating is desired.

For example, in one implementation, 40 g of fumed silica ($SiO_2$) is added to 1 liter of hexafluorosilicic acid $H_2SiF_6$ (35%, ca. 2.85 M), and 100 g of titania ($TiO_2$) is added to 1 liter of fluorotitanic acid $H_2TiF_6$ (60%, ca. 6.13 M) in separate plastic (polypropylene or PFA) containers. U.S. Pat. No. 4,059,680 to Leathers et al. granted on Nov. 22, 1977 discusses a method for preparing fumed silica. The solutions are stirred vigorously for ca. 12 hours. The two acid and oxide mixtures are combined in desired proportions. If the hexafluorotitanic acid molar percentage is higher than ca. 20%, extra silica can be added, since the solubility of silica increases with the hexafluorotitanic acid present. The combined solutions are stirred vigorously for 12-24 h at room temperature (ca. 20° C. or lower). The undissolved solid may be removed from the combined solutions by cyclone separators or crude filtration, and the remaining solutions can be filtered using ca. 0.2 μm vacuum filter. The growth solution is then heated to a desired temperature, such as 40-70° C., and the clean silicon wafers are placed into the growth solution. Once a desired film thickness is achieved, the silicon wafers may be removed, cleaned, and dried. In other implementations, a fluoro acid and silicon mixture combined with a fluoro acid and zirconia mixture may be substituted. In yet another implementations, fluoro acid and titania mixture combined with a fluoro acid and zirconia mixture may be substituted.

Figure 1B:
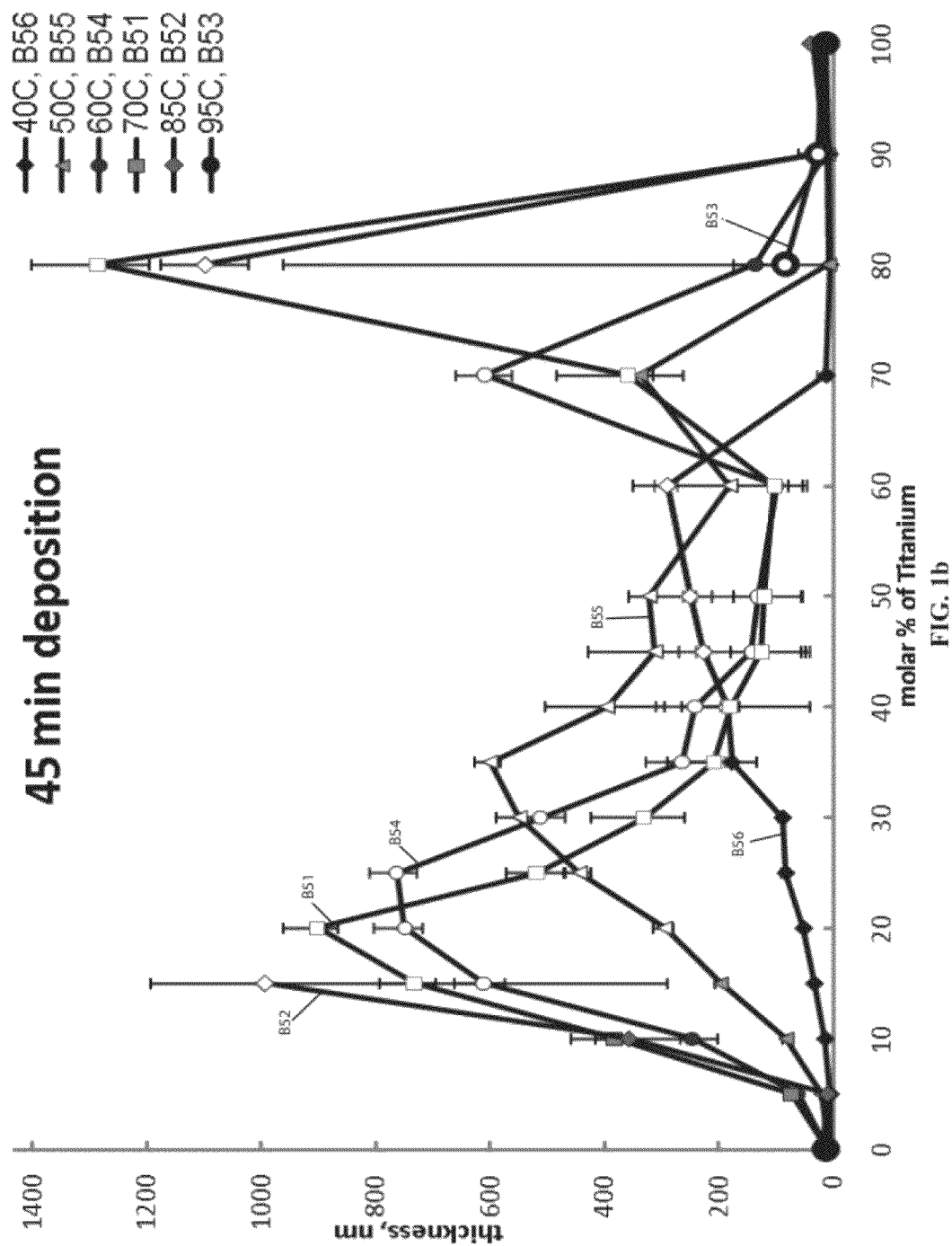

The thickness of the deposited film is a function of the deposition temperature and the molar percentage of the hexafluorotitanic acid in the working solution. FIGS. 1a and 1b respectively show film thickness as a function of the growth solution composition and temperature after 15 and 45 min of deposition. Error bars represent standard deviation, and open symbols indicate precipitated working solutions. Unexpectedly, the deposited film resulted in a silica film, rather than a mixed oxide, deposited at much higher rates than other lower temperature deposition processes. Due to similarities, other growth mixtures using silicon and zirconium or titanium and zirconium may provide similar improvements. The thickness of the deposited silica film is reduced in growth solutions that precipitated. Approximately 1"×2" coupons pre-cleaned by a SAT tool were placed vertically in 30 mL of the growth solution. Deposition temperature above 70° C. may lead to too unstable solutions and reduced growth rates. As can be seen in FIGS. 1a and 1b, lines B52 and B53, representing deposition at 85° C. and 95° C. respectively, which are discontinuous to indicate a precipitated growth solution.

The deposition rate is much higher than other known LPD processes at the same deposition temperature. The deposition rate can be further increased by diluting the growth solution with water to further increase the deposition rate. However, it should be noted that this complicates re-using the growth solution.

The improved methods and systems for deposition of oxide coatings or films also allow re-use of the growth solution. After the liquid phase deposition (LPD), the used growth solution is cooled down to room temperature, and additional oxides, such as $SiO_2$, $TiO_2$, or $ZrO_2$, are added to the growth solution. Note that the additional oxides added may correspond to the initial acid and oxide mixtures. The mixture is incubated for 12-24 hours with vigorous stirring at room temperature or lower. After filtration the growth solution can be re-used for the next batch of LPD growth using the process discussed above.

Figure 2:
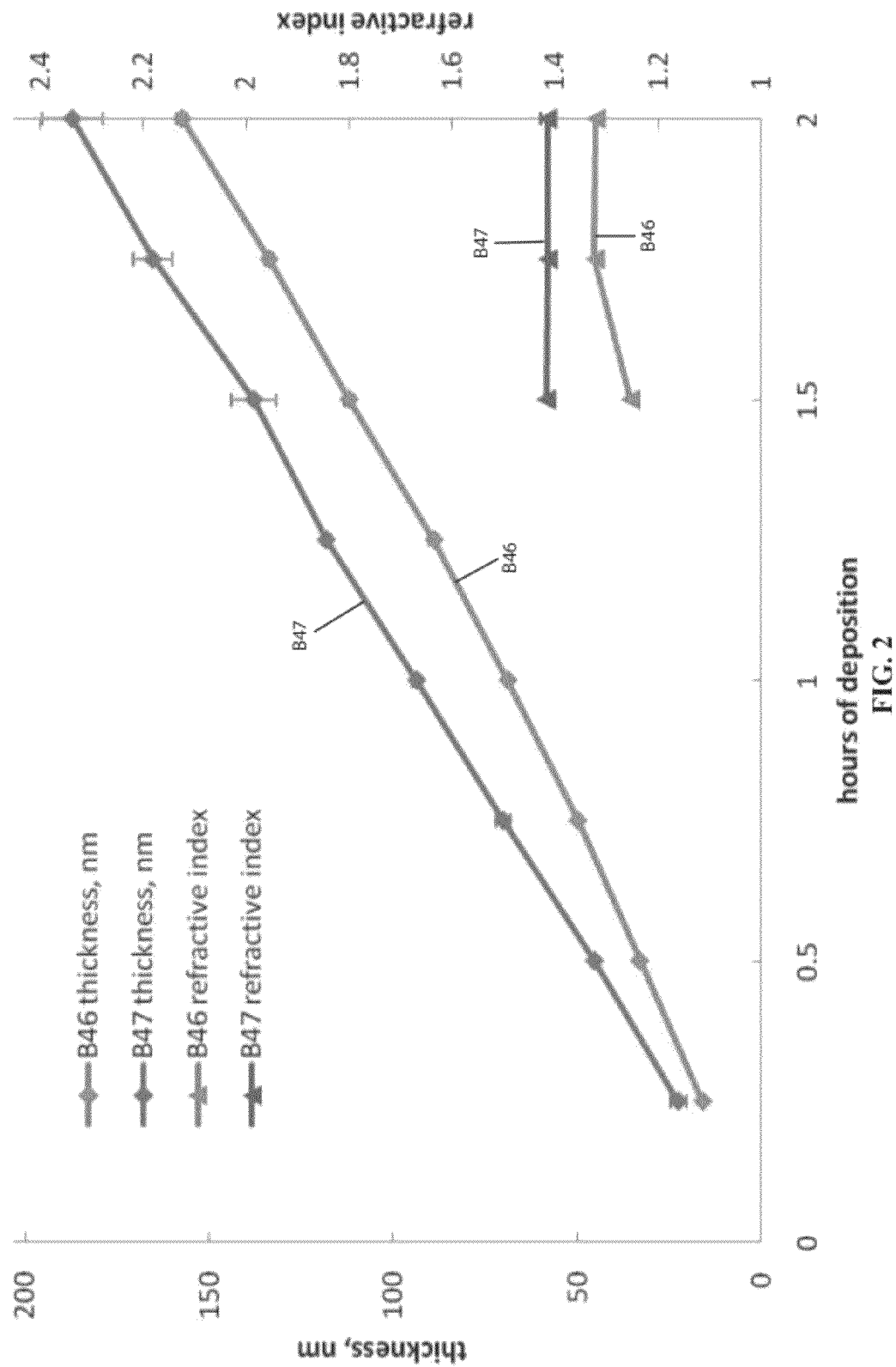
FIG. 2 shows film thickness and refractive index as a function of the deposition time for a fresh solution and a recycled solution.

FIG. 2 shows film thickness and refractive index as a function of the deposition time for a fresh solution and a recycled solution. This re-cycling of the growth solutions was tested using pre-cleaned 4" silicon wafers and 1.3 L of 20% of titanium mixture. The batch B46 was grown at 40° C., then the solution as recovered, re-saturated with oxides, filtered and used to grow the batch B47. The film thickness and refractive index as a function of the deposition time for the first deposition in a freshly prepared solution and the second deposition in the recycled solution show comparable deposition rates for the two batches. Error bars represent the standard deviation.

Nonlimiting examples of applications for the rapid LPD process include the deposition of antireflective (AR) coatings on the silicon solar cells. Deposition of AR coatings on glass or other substrates is also possible. Silica coatings for surface passivation of silicon photovoltaic cells can also be produced by this technique. The method can also be used for depositing an insulator layer on silica for electronics purposes. The silica film has high hardness, and can be deposited on a variety of substrates to protect them from mechanical wear.

The use of mixture of $H_2SiF_6$ and $H_2TiF_6$ and corresponding oxides $SiO_2$ and $TiO_2$ is novel. No other chemicals are used in the growth solutions. The deposition is triggered by the increase of temperature. These methods and systems for deposition of material also allows for easy re-use of the growth solution. The growth solution can be reconstituted by lowering temperature and adding additional oxides, such as $SiO_2$, $TiO_2$, $ZrO_2$, and/or the like. Note that the additional oxides added for reconstitution may correspond to the initial oxides in the initial growth solution. The growth solution can be mixed and incubated, and later re-used in the deposition process.

The systems and methods for deposition discussed can be very sensitive to the solution temperature. Thus, any temperature gradients may lead to gradients in film thickness. The solubility of silica in the mixed $H_2SiF_6/H_2TiF_6$ increases significantly with increase in the molar percentage of $H_2TiF_6$. Sufficient excess of the silica should be provided during solution preparation in accordance with changes in the $H_2TiF_6$ molar percentage. Growth solutions that are not fully saturated tend to have reduced deposition rates. At the same time, if the amount of silica is too much, the loss of the growth solution increases, since undissolved silica retains some of the growth solution. As such, the molar percentage of $H_2TiF_6$ should be carefully considered when determining the amount of silica to be added.

At high deposition temperatures the growth solutions become unstable and precipitate. The higher the deposition rate, the more unstable the solution becomes. A compromise between the solution stability and sufficiently high growth rate can be achieved by varying the $H_2SiF_6/H_2TiF_6$ ratio and the deposition temperature (See FIG. 1).

In addition to $TiO_2/H_2TiF_6$, other similar substances such as $ZrO_2/H_2ZrF_6$ can be used to deposit other films. Nonlimiting examples may include combinations of fluoro acids with metal oxides with a formulation as $M_xO_y$ or $L_xM_yO_z$ (where L and M are metal elements, O is oxygen element); fluoro acids with metal sulfides with a formulation as $M_xS_y$ (M is metal elements, S is sulfur element); and fluoro acids with metal selenides with a formulation $M_xSe_y$ (M is metal elements, Se is selenium element). Films or coatings for solar cells that may be desirable may include $TiO_2$, $ZrO_2$, $In_2O_3$, $SnO_2$, $BaTiO_3$, $ZnS$, $Bi_2Se_3$, indium tin oxide (ITO), and/or the like. A combination with other methods may also possible, such as adding water to the growth solution to increase the film deposition rate. However, it should be noted that adding water makes re-using the chemicals more difficult, since the used solution not only needs to cool down to be re-saturated with the oxides, but also the concentration of the acids need to be increased to the original levels, either by removing water (either by ultrafiltration or by evaporation) or by adding extra acids. In some implementations, it may be desirable to combine the steps of (1) incubating hexafluorosilicic acid with fumed silica and fluorotitanic acids with titania; and (2) mixing the two acid and oxide mixtures together and incubating the combined mixture.

Implementations described herein are included to demonstrate particular aspects of the present disclosure. It should be appreciated by those of skill in the art that the implementations described herein merely represent exemplary implementation of the disclosure. Those of ordinary skill in the art should, in light of the present disclosure, appreciate that many changes can be made in the specific implementations described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The implementations described hereinabove are meant to be illustrative only and should not be taken as limiting of the scope of the disclosure.

What is claimed is:

1. A method for depositing an oxide film, the method comprising:
   mixing a first acid and a second oxide to form a first mixture wherein the first acid is hexafluorosilicic acid ($H_2SiF_6$) and the first oxide is silica ($SiO_2$);
   mixing a second acid and a second oxide to form a second mixture, wherein the second acid and the second oxide; are either fluorotitanic acid ($H_2TiF_6$) and titania or fluorozirconic acid ($H_2ZrF_6$) and zirconia;
   mixing the first and second mixtures together to form a growth solution wherein the growth solution is incubated for a predetermined incubation period;
   removing undissolved oxides from the growth solution;
   heating the growth solution to a predetermined temperature;
   placing a substrate into the growth solution for a predetermined deposition period, wherein a silicon oxide film is deposited; and
   removing the substrate from the growth solution.

2. The method of claim 1, wherein the first and second mixtures are incubated at room temperature.

3. The method of claim 1, wherein the first and second mixtures are incubated for at least 12 hours.

4. The method of claim 1, wherein the predetermined incubation period is at least 12 hours.

5. The method of claim 1, wherein the growth solution is incubated at room temperature.

6. The method of claim 1, wherein the predetermined temperature is greater than or equal to 40° C. and less than or equal to 70° C.

7. The method of claim 1, wherein 40 grams of fumed silica are added for every 1 liter of hexafluorosilicic acid (2.85 M).

8. The method of claim 1, wherein 100 grams of titania are added for every 1 liter of fluorotitanic acid (6.13 M).

9. The method of claim 1, further comprising:
   cooling the growth solution to room temperature after the substrate is removed, wherein water was not added to the growth solution in prior deposition steps;
   mixing additional oxides into the growth solution to form a recycled growth solution for a subsequent deposition, wherein the recycled growth solution is incubated for a second predetermined incubation period; and
   removing undissolved oxides from the recycled growth solution.

10. The method of claim 9, wherein the additional oxides are silica, titania, zirconia, or a combination thereof.

11. The method of claim 1, wherein the undissolved oxides are removed by filtration or cyclone separation.

12. The method of claim 1, wherein the silicon dioxide film is deposited at a rate of approximately 100 nm/hr.

* * * * *